United States Patent [19]

Hansen et al.

[11] Patent Number: 4,735,580
[45] Date of Patent: Apr. 5, 1988

[54] TEST ADAPTER FOR INTEGRATED CIRCUIT CARRIER

[75] Inventors: William D. Hansen, Santa Fe Springs; Raymond F. Mix, Pomona; Robert J. Poirier, Upland, all of Calif.

[73] Assignee: ITT Corporation, New York, N.Y.

[21] Appl. No.: 944,774

[22] Filed: Dec. 22, 1986

[51] Int. Cl.$^4$ .............................................. H01R 23/72
[52] U.S. Cl. ..................................... 439/264; 439/912
[58] Field of Search ............ 339/17 C, 75 M, 75 MP, 339/200 P, 174; 324/158 P, 158 F; 439/70; 71, 263, 264, 269, 912

[56] References Cited

U.S. PATENT DOCUMENTS

| Re. 28,064 | 7/1974 | Venaleck et al. | 339/200 P |
|---|---|---|---|
| 3,551,878 | 12/1970 | Rossman | 339/17 CF |
| 4,190,311 | 2/1980 | Basta | 439/311 |
| 4,541,676 | 9/1985 | Hansen et al. | 439/912 |
| 4,671,590 | 6/1987 | Ignasiak | 439/266 |
| 4,672,592 | 6/1987 | Ignasiak | 439/331 |

OTHER PUBLICATIONS

"Clip-A-Dip", Photographs, Device Made in UK.
AP Products Catalog, p. 2, Division of 3M.
EDN Product News, Advertisement for AP Products Test Clip, 7-1986.

Primary Examiner—Neil Abrams
Attorney, Agent, or Firm—T. L. Peterson

[57] ABSTRACT

A test adapter is provided for connection to a PLCC (Plastic Leaded Clip Carrier), hereinafter referred to as a carrier, which assures accurate alignment with the carrier, which can be locked to the carrier during a test, which has a width only slightly greater than that of the carrier to enable testing of closely mounted carriers, and which can be simply constructed. The adapter includes an inner housing that bears against the top of the carrier and four contact frames pivotally mounted on the housing and carrying contacts that engage leads of the carrier. Each contact frame has separators between the contacts, the separators passing between the leads of the carrier to directly engage the sides of the carrier housing. The lower surface portions of the separators are slightly angled from the vertical so when they press against angled surfaces on the carrier housing sides, the adapter is locked to the carrier. The contact frames are held to the housing to pivot thereon by a snap ring that extends around the four frames and is supported by the frames.

7 Claims, 4 Drawing Sheets

TEST ADAPTER FOR INTEGRATED CIRCUIT CARRIER

BACKGROUND OF THE INVENTION

A test adapter can have numerous contacts for engaging the leads of a PLCC (Plastic Leaded Chip Carrier), which is a flat four-sided carrier having leads extending from the sides. The contacts on the test adapter route electrical signals from closely spaced leads on the carrier to test points sized and spaced for standard industry connectors. One type of prior art adapter is aligned with the carrier by aligning several positioning pins on the adapter with corresponding holes in the carrier, and then slipping attachment hooks under two opposing corners of the carrier. The outside of the carrier is then pushed down to move its contacts onto the leads of the carrier. One shortcoming of such prior art adapter is that there may be poor alignment of the adapter with the carrier because of slight irregularities in the carriers. Also, uneven pressure can be applied during actuation, which sometimes causes an adapter contact to short two of the carrier leads.

Another type of prior art adapter has four frames that are pivoted apart by squeezing two sections between the finger and thumb in the manner of a closepin, while a cam mechanism opens the other two sides. The device is placed on the carrier and released to move the contacts against the carrier leads. A metal spring applies the necessary clamping force. This has the disadvantage that there is assymetrical clamping force, resulting in the possibility of misalignment, the adapter contacts do not make wiping action with the carrier leads, and a metal spring is required so an all-plastic adapter (except for the contacts) is not realized.

An adapter which assured alignment of its contacts with the carrier leads, which assured uniform clamping forces around the carrier, and which has constructed compactly and at low cost without the need for metal springs or other metal parts other than the contacts, would be of considerable value.

SUMMARY OF THE INVENTION

In accordance with one embodiment of the present invention, an adapter is provided which has contacts which connect to the leads of an integrated circuit carrier, wherein the adapter is reliable, compact, and economical. The adapter can include an inner housing which bears against the carrier and which pivotally supports contact frames having contacts that engage the leads of the carrier. Each frame can be formed with separators between the contacts, with the separators thin enough to pass between the leads of the carrier to engage the sides of the carrier housing. A cam movable on the adapter can pivot the contact frames to move the lower surfaces thereof against sides of the carrier. A snap ring can be supported on the frames and encircle them near the location where the frames are pivotally mounted on the housing, to simultaneously hold the frames to the housing while enabling the frames to pivot on the housing in a simple and compact arrangement.

The novel features of the invention are set forth with particularity in the appended claims. The invention will be best understood from the following description when read in conjunction with the accompanying drawings.

DESCRIPTION OF THE PREFERRED EMBODIMENTS

Figure 1:
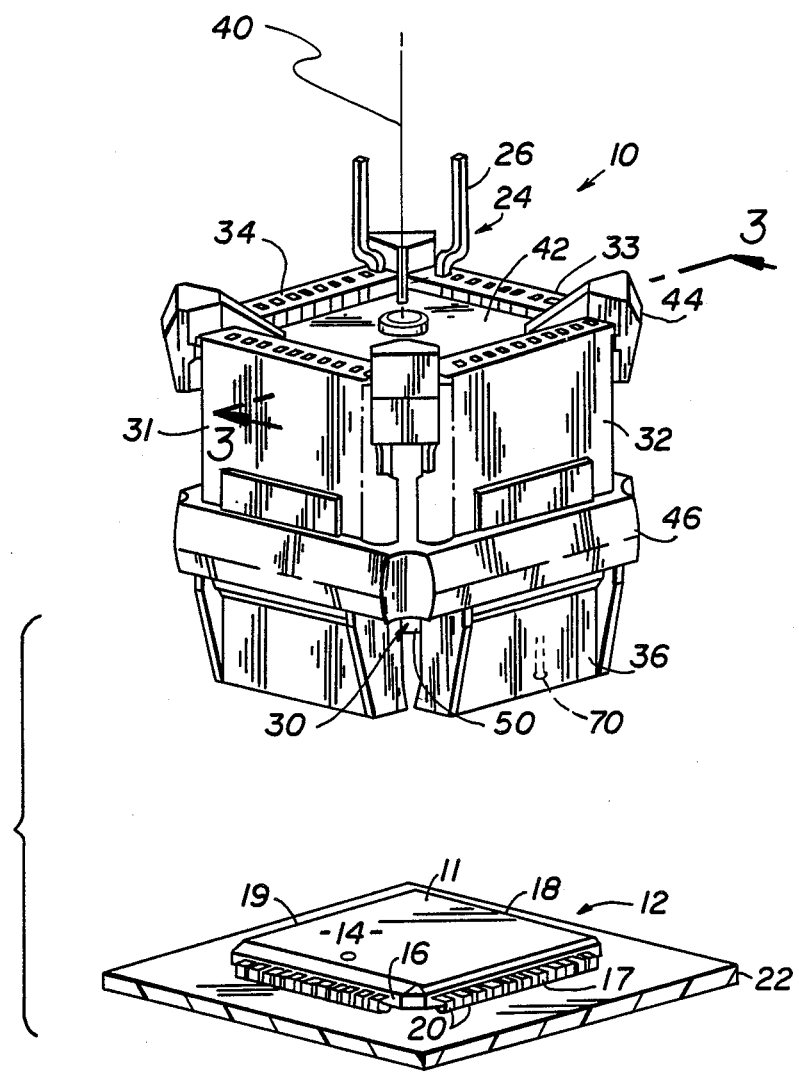
FIG. 1 is a perspective view of an adapter constructed in accordance with one embodiment of the present invention, and of a carrier which the adapter is designed to engage.

FIG. 1 illustrates an adapter 10 which is designed to engage an integrated circuit carrier 12 of the type that is commonly referred to as a Plastic Leaded Chip Carrier (PLCC or PCC). The carrier 12 has a housing 11 with a top surface 14 and four sides 16–19. A row of spaced electrically conductive leads 20 extends from each side of the carrier housing onto solder pads of a printed circuit board 22. The adapter 10 includes numerous contacts 24 that each have lower ends 70 that make electrical connection with the leads 20 of the carrier, and which each have upper ends 26 that are easily accessible for connection to test instruments.

The adapter 10 includes a housing assembly or adapter housing 30 which includes an inner housing 50, and four contact frames 31–34 that are pivotally mounted on the inner housing. In use, the inner housing 50 is lowered against the top surface 14 of the carrier. Then the frames 31–34 on which the contacts 24 are mounted, are pivoted so their lower portions 36 moves inwardly towards the vertical axis 40 of the adapter, causing the lower portions of the frames to latch against the sides of the carrier housing 11. Such pivoting of the frames is controlled by a locking wedge or cam device 42 that can slide vertically within the frames, and which has four corner portions 44 of which two at a time can be grasped by the hand and pushed down or up. A snap ring 46 of the housing assembly surrounds the contact frames and holds them to the inner housing 50 which lies within the area surrounded by the four frames. It should be noted that while the carrier top surface 14 commonly lies in a plane about parallel with the horizon so the adapter 10 is moved perpendicularly thereto onto and off of it, the parts can be used in a wide variety of orientations, and the terms "vertical" and "horizontal" herein refer to the relative orientation of the parts.

Figure 2:
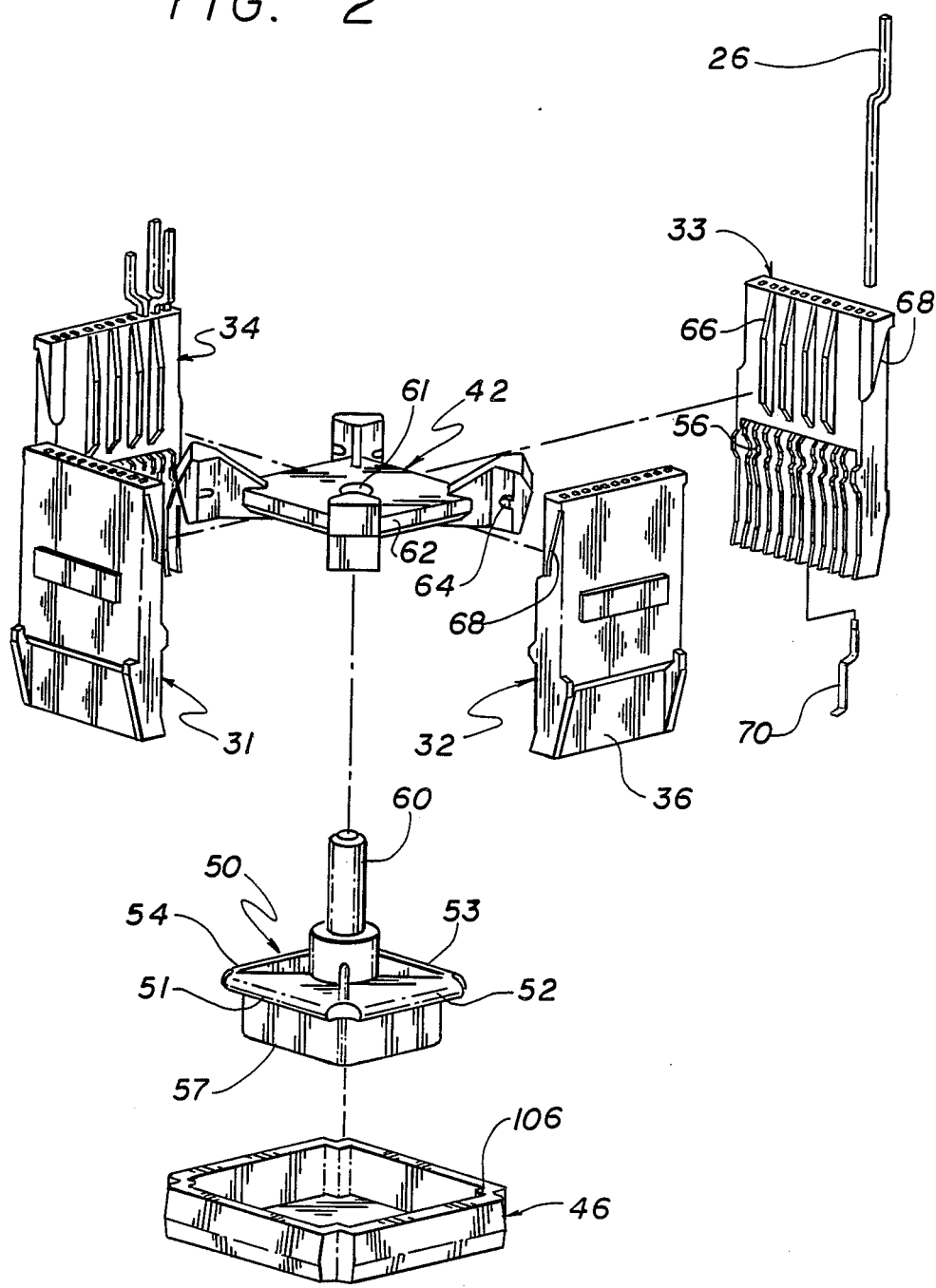
FIG. 2 is a perspective exploded view of the adapter of FIG. 1.

FIG. 2 illustrates the parts of the adapter 10. The inner housing 50 is formed with pivot supports 51–54 that pivotally engage pivot surfaces 56 formed at the inside of the contact frames such as 33. The inner housing 50 also has a vertical guide 60 in the form of a rod which fits into a hole 61 in the cam device 42 to closely guide it in vertical movement. The cam device carries first and second cams 62, 64 which engage corresponding tracks or cam followers 66, 68 on the frames. When the cam device is moved down, the lower portions 36 of the frames move towards the carrier, and when the cam device moves up, the lower portions of the frames move away from the carrier. The inner housing has a lower surface 57 for resting on a carrier housing top.

Figure 3:
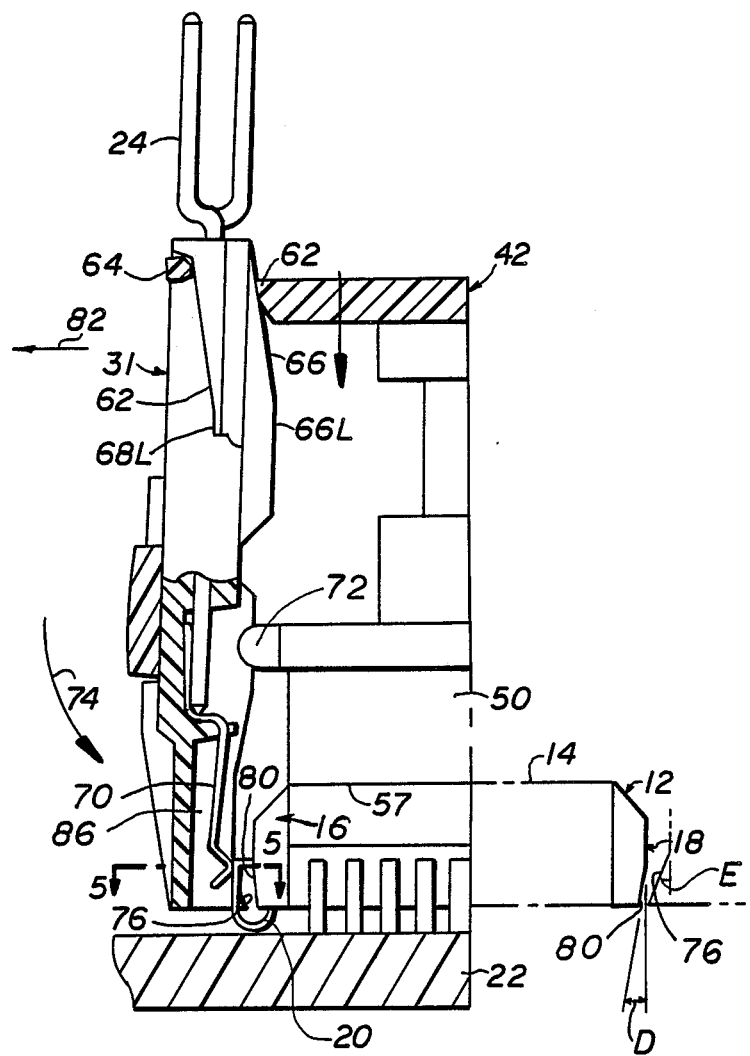
FIG. 3 is a sectional view taken on the line 3—3 of FIG. 1, with the adapter engaged with the carrier except that the carrier frames have not been pivoted to their fully engaged position.

FIG. 3 shows the adapter in a configuration wherein the lower surface 57 of the inner housing 50 has been moved against the top surface 14 of the carrier, but the adapter has not yet been latched to the carrier. During downward movement of the adapter, lower contact parts 70 of the contacts wipe across the carrier leads 20 to make wiping contact therewith. Then, the cam device 42 is moved down to pivot each contact frame such as 31 about a corresponding horizontal pivot axis 72, in the direction indicated by arrow 74. This causes a latch surface 76 at the lower portion of each contact frame to move against a lower latching surface portion 80 at each side such as 16 of the carrier housing. Both of these engaging surfaces 76, 80 extend at an angle D or E of a plurality of degrees from the vertical (from the adapter axis 40 and a line normal to the carrier top surface 14), so that such surfaces 76, 80 lying at opposite sides 16, 18 of the carrier converge in a downward direction.

Figure 4:
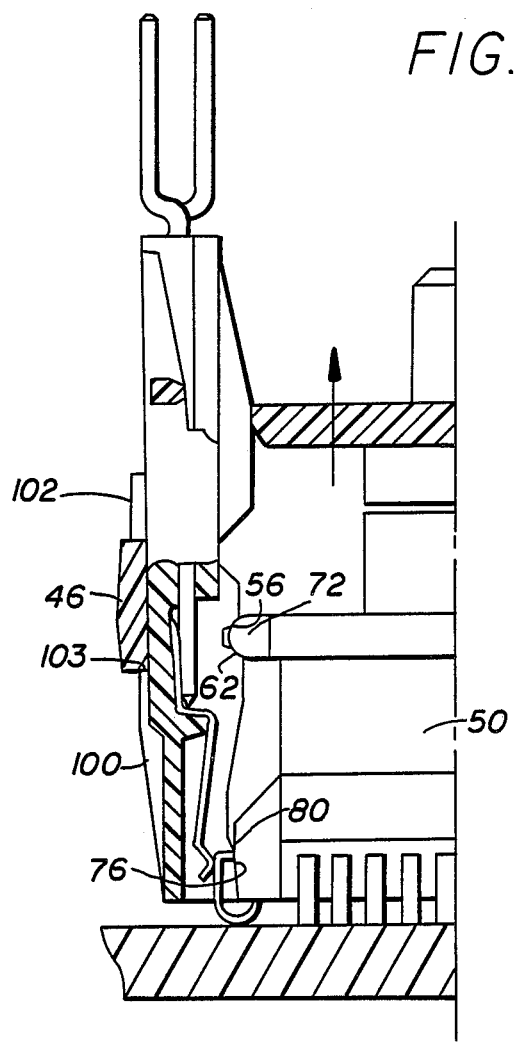
FIG. 4 is a view similar to FIG. 3, but with the carrier frames in a fully engaged position.

FIG. 4 shows the contact frame pivoted to its latched position, with the surfaces 76, 80 on the frame and carrier engaged. Such engagement latches the adapter to the carrier so it will not lift off the carrier as long as the frames are pivoted to their latched positions.

In the unlatched orientation of FIG. 3, the first and second cams 62, 64 engage upper portions of the cam followers or tracks 66, 68 of the frames. Upper portions of the tracks 66, 68 are each angled by a plurality of degrees away from the vertical, so that the upper portions of the tracks at opposite sides of the adapter converge in a downward direction. Thus, as the cam device 42 is pushed down and moves vertically, its cams 62, 64 push the upper ends of the frames outwardly in the direction of arrow 82, away from the axis of the adapter, to cause the lower portions of the frames to move inwardly towards the latching configuration. Lower portions 66L, 68L of the track extend vertically, so that once the cam device has been moved down, the pressure of the frames on the cams will not move the cam device back up. Instead, it requires a person to lift the cam device 42 to pivot the frames so as to unlatch the adapter from the carrier.

Figure 5:
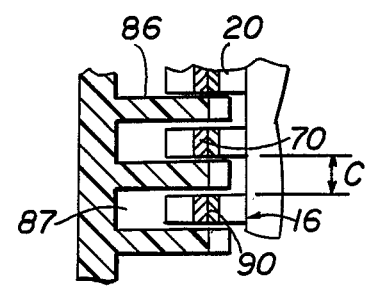
FIG. 5 is a view taken on the line 5—5 of FIG. 3.

The lower portion of each contact frame includes a row of barriers or separators 86 that are also shown in FIG. 5. The barriers 86 each have a width slightly less than the separation C between adjacent leads 20 on the carrier, to allow the barriers to move through the space between the leads and directly contact the sides such as 16 of the carrier. The contacts lie in slots 87 formed between the barriers. The barriers also assure accurate lateral alignment of the adapter lower contacts 70 with the carrier leads 20 to assure contact between them and to prevent an adapter lead 70 from simultaneously engaging two carrier leads to short circuit them. Thus, the multiple spaced separators with their angled latching surfaces serve not only to directly engage lower surfaces at opposite sides of the carrier to latch the adapter to the carrier, but also serve to accurately align adapter contacts with the carrier leads.

It may be noted that the lower contacts 70 lie between the barriers 86. When the adapter is completely away from the carrier, only a small portion of the contacts, at the contacting regions 90, extend beyond the space between adjacent barriers 86. The barriers serve to protect the contacts against damage. Damage is further avoided by the fact that the contacting regions 90 of the lower contacts lie on the inside of the frames, so they will not be touched unless someone places an instrument within the hollow space between the frames.

The snap ring 46 (FIG. 4) surrounds the four contact frames 31-34 to hold the adapter parts together and to press the pivot surface 56 of each frame against the pivot support 62 formed along a corresponding side of the inner housing 50. The snap ring is held in place by a pair of snap retainers 100, 102 formed on each contact frame, and the snap ring is installed by forcing it along and beyond one of the retainers such as 100 into a snap ring receiving space 103. The snap ring is formed with bent corner portions 106 (FIG. 2) which enable expansion of the snap ring during installation, and which enables it to snap back to firmly hold the pivot surface of each frame against the corresponding support surface. Since the snap ring extends in a closed loop and is supported on the frames, it can be constructed so it is thin. Since the snap ring is the radially outermost portion of the adapter (extends furthest from the adapter axis), the thinness of the snap ring results in an adapter of small width. This is useful in enabling the mounting of two adapters on adjacent circuit carriers which are relatively closely spaced, without interference of the adapters.

The entire adapter, except for the contacts, can be constructed of plastic molded parts. No metal spring or the like is required. This avoids the use of metal parts that can either corrode or which must be of a higher cost metal to avoid corrosion. The contacts are typically gold-plated to assure low contact resistance, and therefore are resistant to corrosion.

Thus, the invention provides an adapter for coupling to a circuit carrier, which is reliable, compact, and of low cost. The adapter has separators between contacts of a row, the separators arranged to pass between the leads of the carriers to contact opposite sides of the carrier housing, and the separators have surfaces angled from the vertical for latching to the carrier to hold the adapter securely thereon. The contacts are mounted on contact frames pivotally supported on an inner housing and held thereon by a snap ring which surrounds the frames to hold them together and which is supported on the frames. A cam device slideably mounted within the housing pivots the frames to move the contacts firmly against the carrier leads while latching the separators on the frames against the carrier housing sides.

Although particular embodiments of the invention have been described and illustrated herein, it is recognized that modifications and variations may readily occur to those skilled in the art, and consequently, it is intended that the claims be interpreted to cover such modifications and equivalents.

What is claimed is:

1. An adapter for coupling a circuit carrier which includes a carrier housing having a top and a plurality of sides, and a plurality of rows of leads each extending along a different one of said carrier housing sides, comprising:

an adapter housing assembly which includes a first housing part which has a surface that can be moved downwardly adjacent to the top of said carrier housing, and a cam device which is movably mounted relative to the first housing part between unlatched and latched positions, said cam device having first and second cam means thereon;

a contact frame pivotally mounted about a first axis of said first housing part, and a plurality of electrical contacts mounted on said frame in a row thereon and having contact surfaces which wipe downwardly against said carrier leads as said housing assembly moves down toward the top of said carrier housing, said frame having a first portion pivotally mounted about a first axis on said first housing part and a second portion engaged with said first cam means so as said cam device is moved from said unlatched position to said latched position it pivots said frame about said first axis to press said contact surfaces with increased pressure against said leads, and said frame having a third portion engaged by said second cam means so as said cam device is moved from said latched position to said unlatched position it pivots said frame about said first axis to reduce the pressure of said contact surfaces against said leads.

2. An adapter for coupling to a circuit carrier wherein the carrier includes a housing with an upper surface and a plurality of sides, and a plurality of leads extending from said sides, comprising:

an adapter housing assembly which includes a first housing part which can be moved downwardly adjacent to the upper surface of the carrier and which has a plurality of sides and forms a plurality of pivot supports at a plurality of said sides;

a plurality of contact frames, each having an inner side forming a pivot surface which mates with one of said pivot supports to pivot thereon between first and second positions, each frame having a plurality of contacts positioned to firmly engage a plurality of said carrier leads in the second position of the frame;

a snap ring encircling said frames and lying against the outside of said frames at a location directly opposite said pivot supports, and holding said frames to said first housing part;

said frames having snap retainers and said snap ring being deformable to pass across said retainers and become trapped thereon, and said snap ring being supported on said frames whereby to provide an adapter to small width.

3. The adapter described in claim 2 wherein:
said first housing part forms four substantially perpendicular sides with a pivot support at each side;
said contact frames comprise four frames, one at each of said housing part sides and each having a pivot surface pivotally engaged with one of said pivot supports;
said snap ring is substantially in the form of a band and is supported substantially only by said contact frames.

4. The adapter described in claim 3 wherein:
said snap ring has four sides and four corners, and has a bent portion at each corner which permits elastic expansion of the snap ring by unbending at the corner.

5. The adapter described in claim 2 wherein:
each of said frames forms first and second track surfaces angled a plurality of degrees from the vertical, and facing in substantially opposite directions;
said housing assembly includes a second housing part movable on the first part between latched and unlatched positions and having a pair of cams respectively movable along said first and second tracks to pivot said frames between said first and second positions.

6. The adapter described in claim 5 wherein:
said second housing part is vertically slideably mounted on said first housing part, and the lower ends of said tracks are substantially vertical, whereby to retain the frames in their latched positions.

7. An adapter for coupling to a circuit carrier wherein the carrier includes a housing with an upper surface and a plurality of sides, and a plurality of leads extending from at least two opposite sides, comprising:

an adapter housing assembly which includes a first housing part which can be moved downwardly adjacent to the upper surface of the carrier, and a cam device having first and second cam means thereon, said cam device being movably mounted relative to said first housing part between unlatched and latched positions;

at least one pair of contact frames, said frames being pivotally mounted on opposite sides of said first housing part, and a plurality of electrical contacts mounted on each said frame in a row thereon and having contact surfaces which wipe downwardly against said carrier leads as said housing assembly moves down toward the upper surface of said carrier housing, each said contact frame having inner and outer cam followers on opposite sides of said frame;

said first cam means engaging said first cam follower so as said cam device is moved from said unlatched position to said latched position said first cam means pivots said frames to press said contact surfaces with increased pressure against said leads; and said second cam means engaging said second cam follower so as said cam device is moved from said latched position to said unlatched position said second cam means pivots said frames to reduce the pressure of said contact surfaces against said leads.

* * * * *